United States Patent
Huang et al.

(10) Patent No.: US 9,788,453 B2
(45) Date of Patent: Oct. 10, 2017

(54) SERVER

(71) Applicant: MITAC COMPUTING TECHNOLOGY CORPORATION, Hsinchu (TW)

(72) Inventors: Chung-Ta Huang, Hsinchu (TW); Chih-Wei Lee, Hsinchu (TW)

(73) Assignee: MITAC COMPUTING TECHNOLOGY CORPORATION, Hsinchu (TW)

(*) Notice: Subject to any disclaimer, the term of this patent is extended or adjusted under 35 U.S.C. 154(b) by 29 days.

(21) Appl. No.: 14/950,846

(22) Filed: Nov. 24, 2015

(65) Prior Publication Data
US 2017/0150635 A1    May 25, 2017

(51) Int. Cl.
*H05K 7/14* (2006.01)

(52) U.S. Cl.
CPC ................... *H05K 7/1492* (2013.01)

(58) Field of Classification Search
CPC .... H05K 7/1489; H05K 7/1492; G06F 1/184; G06F 1/188; G06F 1/189
USPC ........................ 361/679.02, 679.48, 727, 796
See application file for complete search history.

(56) References Cited

U.S. PATENT DOCUMENTS

| | | | |
|---|---|---|---|
| 7,894,195 B2* | 2/2011 | Lin .................. | G06F 1/184 361/727 |
| 8,134,843 B2* | 3/2012 | Wu .................. | G06F 1/184 361/788 |
| 2014/0029194 A1* | 1/2014 | Hayashi ............ | H05K 7/20136 361/679.48 |

* cited by examiner

*Primary Examiner* — Tuan T Dinh
*Assistant Examiner* — Mukund G Patel
(74) *Attorney, Agent, or Firm* — Akerman LLP; Peter A. Chiabotti

(57) ABSTRACT

A server includes a chassis, a power bridge module having a first power connector, a backplate having a first signal connector, a tray, a motherboard module and a signal bridge board. The motherboard module is fixed to the tray, and includes a second power connector detachably and electrically connected to the first power connector. The signal bridge board includes a second signal connector detachably and electrically connected to the first signal connector. Removal of the tray out of the chassis results in removal and electrical disconnection of the second signal connector from the first signal connector, and removal and electrical disconnection of the second power connector from the first power connector.

12 Claims, 5 Drawing Sheets

SERVER

FIELD

The disclosure relates to a server, more particularly to a server that enables a relatively quick and easy hot swapping process.

BACKGROUND

A conventional server, such as a rack mount server, includes a chassis that defines an accommodating space, a plurality of data storage devices, a plurality of trays, a plurality of motherboards that include a plurality of chips disposed thereon, a plurality of signal bridge boards, a backplate, a power supply, and a plurality of electrical cables that are respectively and electrically connected to the motherboards. The accommodating space is divided into a data storage device area located in a front portion of the server, and a motherboard area located in a rear portion of the server. The data storage devices, e.g., harddrives, are disposed in the data storage device area. The motherboards are respectively and securely received in the trays. Each of the signal bridge boards is disposed at a location corresponding to a respective one of the motherboards and is detachably connected to the backplate. The power supply supplies electric power to the motherboards through the electrical cables.

The backplate is vertically disposed between the data storage device area and the motherboard area. A plurality of sockets are disposed on a surface of the backplate that faces the motherboard area, and are directly and electrically connected to the signal bridge boards, respectively.

When the chips of the motherboards are supplied with the electric power to perform computation or manage signal delivery, removal and electrical disconnection of the signal bridge boards and the sockets of the backplate prior to stop supplying the electric power to the respective motherboards would cause error in signal delivery, thereby leading to malfunction or even damage of the entire server system. Thus, the cables need to be detached from the motherboards, or a commend needs to be sent to the server system to stop supplying the electric power to the motherboards before removal of each of the motherboards for hot swapping. As a result, the hot swapping process is not only inconvenient but also time consuming, thus further improvement is needed.

SUMMARY

Therefore, an object of the disclosure is to provide a server that allows for a relatively quick and easy hot swapping process.

According to one aspect of the disclosure, the server includes a chassis, a power supply module, a power bridge module, a backplate, a tray, a motherboard module and a signal bridge board.

The chassis defines an accommodating space. The power supply module is disposed in the accommodating space. The power bridge module is disposed in the accommodating space, is electrically connected to the power supply module for receiving electric power therefrom, and includes a first power connector for outputting the electric power. The backplate is disposed in the accommodating space and includes a first signal connector. The tray is removably inserted into the accommodating space. The motherboard module is fixedly mounted to the tray, and includes a second power connector that is detachably and electrically connected to the first power connector of the power bridge module. The signal bridge board is electrically connected to the motherboard module, and includes a second signal connector that is detachably and electrically connected to the first signal connector of the backplate.

Removal of the tray out of the accommodating space results in removal and electrical disconnection of the second signal connector from the first signal connector of the backplate, and removal and electrical disconnection of the second power connector of the motherboard module from the first power connector of the power bridge module.

According to another aspect of the disclosure, the server includes a chassis, a power supply module, a power bridge module, a backplate, a plurality of trays, a motherboard module and a plurality of signal bridge boards.

The power bridge module is disposed in the accommodating space, and includes a plurality of power bridge boards that are electrically connected to the power supply module for receiving electric power therefrom. Each of the power bridge boards includes a first power connector for outputting the electric power. The backplate is disposed in the accommodating space and includes a plurality of first signal connectors. The trays are removably inserted into the accommodating space and correspond in position to the power bridge boards, respectively. The motherboard module is fixedly mounted to the trays, and includes a plurality of motherboards each having a second power connector that is detachably and electrically connected to the first power connector of a respective one of the power bridge boards. The signal bridge boards are electrically and respectively connected to the motherboards. Each of the signal bridge boards includes a second signal connector that is detachably connected to a respective one of the first signal connectors of the backplate.

Removal of each of the trays out of the accommodating space results in removal and electrical disconnection of the second signal connector of a respective one of the signal bridge boards from the respective one of the first signal connectors of the backplate, and removal and electrical disconnection of the second power connector of a respective one of the motherboards from the first power connector of the respective one of the power bridge boards.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
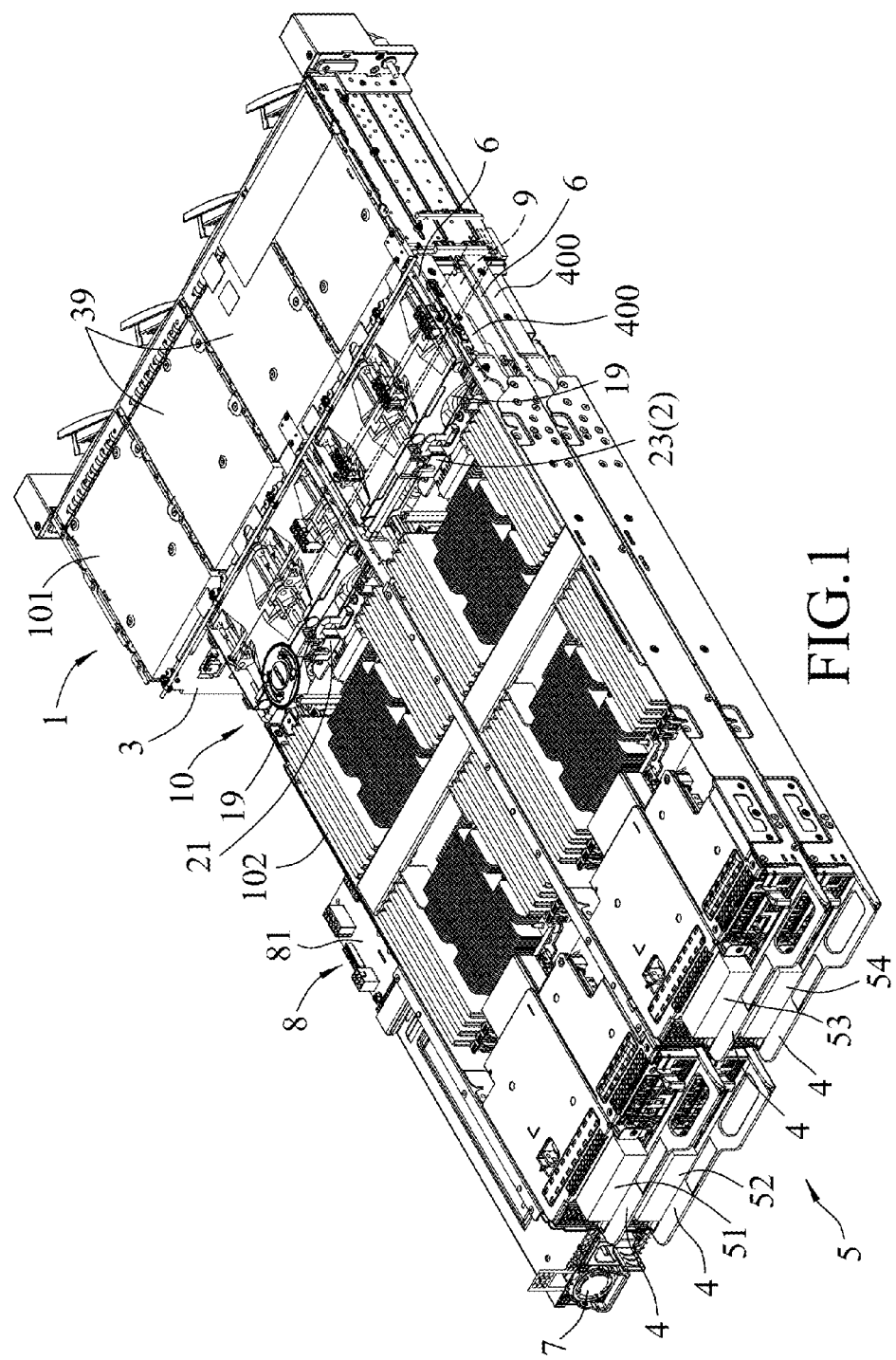
FIG. 1 is a perspective view of an embodiment of a server according to the disclosure.
Figure 2:
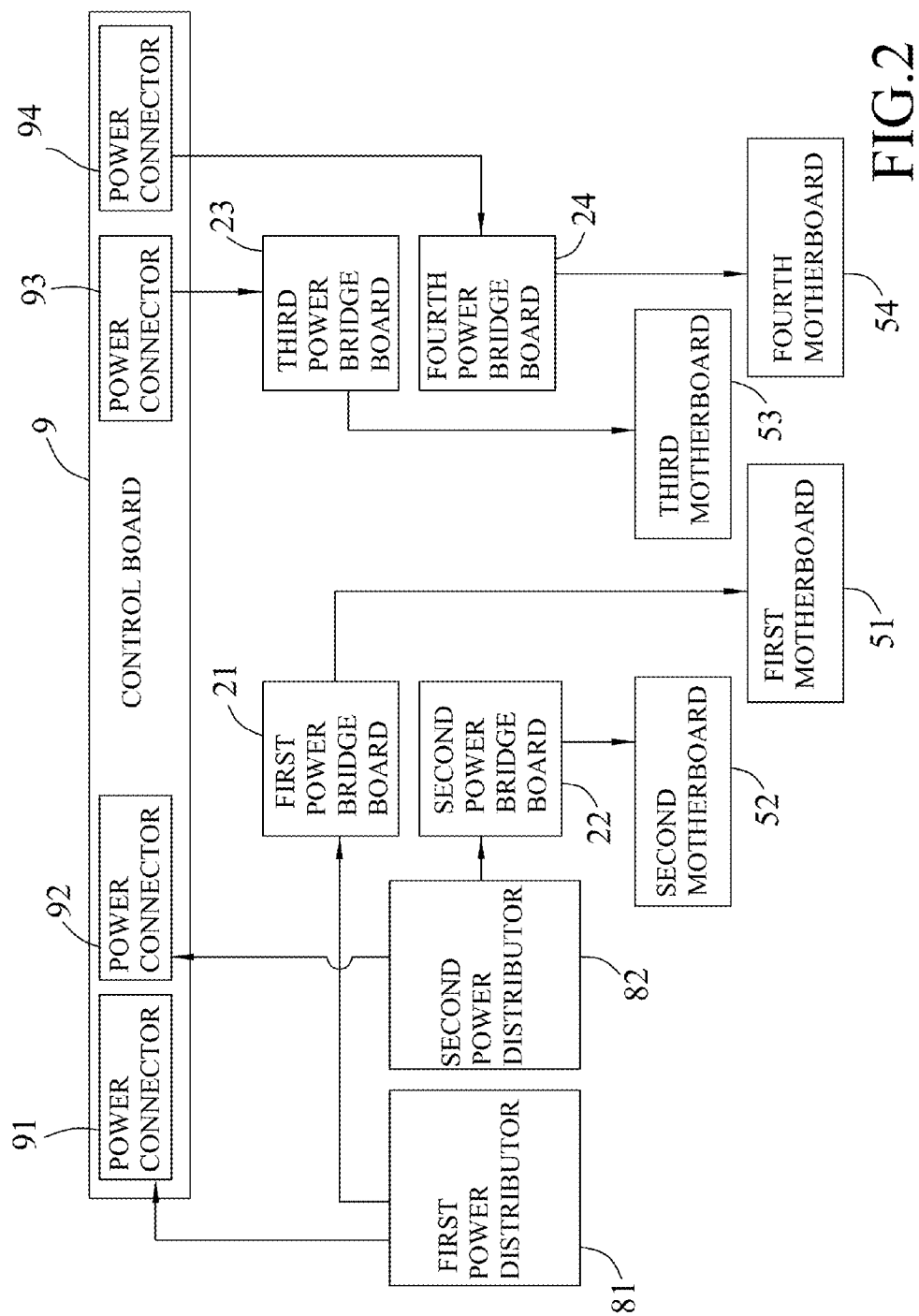
FIG. 2 is a schematic block diagram of the embodiment, illustrating power distribution of two power distributors, a control board, a plurality of power bridge boards and a plurality of motherboards.
Figure 3:
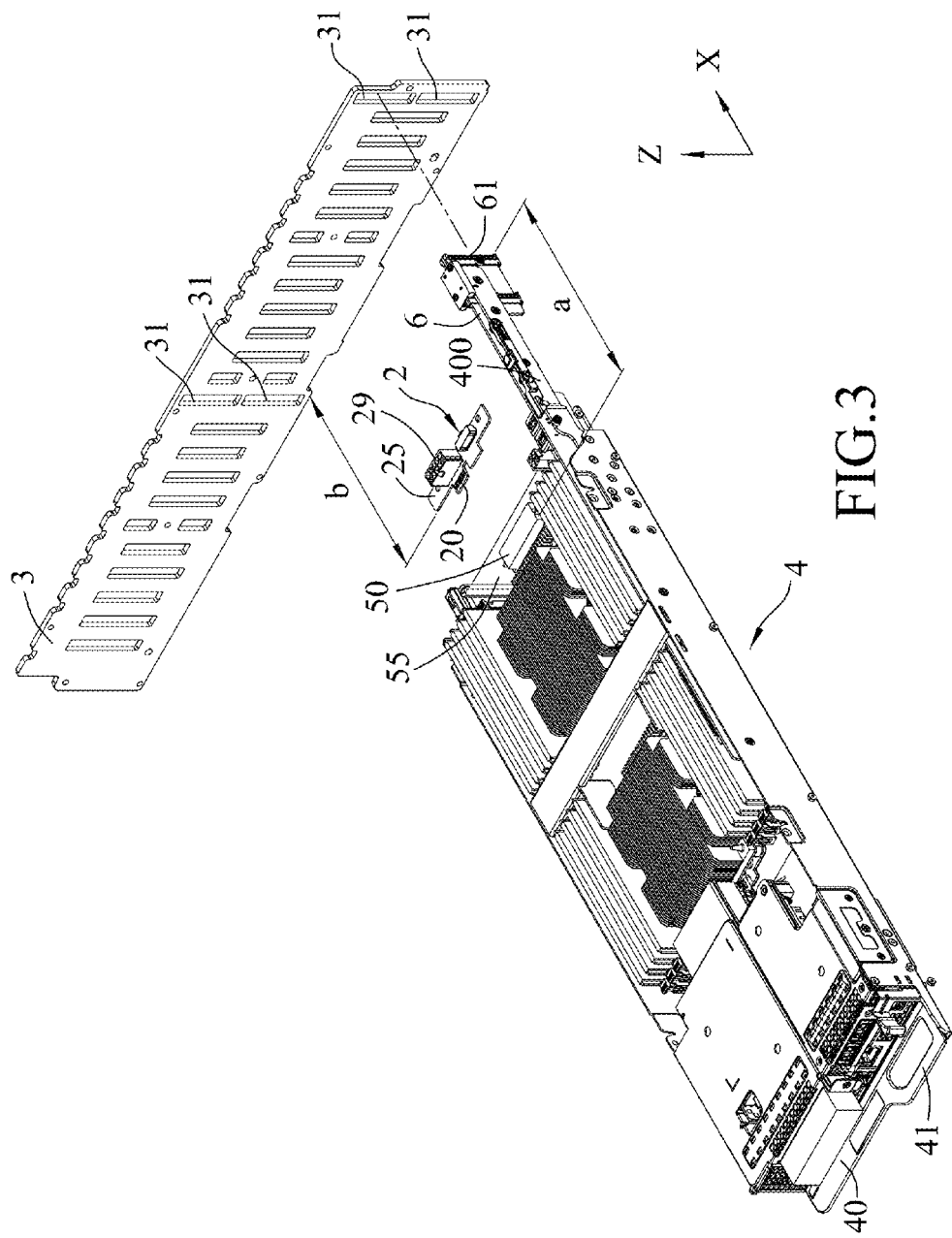
FIG. 3 is a partly exploded perspective view of the embodiment, illustrating that a signal bridge board and a corresponding signal connector of a backplate, and a power connector of one of the motherboards and a corresponding power connector of the power bridge boards are configured to be hot swappable.

Referring to FIGS. 1 to 3, an embodiment of a server according to the disclosure includes a chassis 1, a plurality of fans 19, a power supply module 7, a power distributing module 8, a control board 9, a power bridge module 2, a plurality of data storage devices 39, four trays 4, four protective strips 400, a motherboard module 5, a backplate 3 and four signal bridge boards 6.

The power bridge module 2 includes a first power bridge board 21, a second power bridge board 22, a third power bridge board 23 and a fourth power bridge board 24. The motherboard module 5 includes a first motherboard 51, a second motherboard 52, a third motherboard 53 and a fourth motherboard 54.

The chassis 1 defines an accommodating space 10 that is divided into a data storage device area 101 and a motherboard area 102. The data storage device area 101 is located in a front portion of the server and accommodates the data storage devices 39, e.g., hard drives. The motherboard area 102 is located in a rear portion of the server and accommodates the trays 4 that receive the motherboards 51, 52, 53, 54, respectively.

The fans 19 are fixedly disposed between the data storage device area 101 and the motherboard area 102, and dissipate heat, which is generated by the motherboards 51, 52, 53, 54, from the chassis 1.

The power supply module 7 is disposed in the accommodating space 10, includes a plurality of power connectors (not shown), and supplies electric power to the fans 19, the data storage devices 39 and the motherboards 51, 52, 53, 54.

The power distributing module 8 is disposed in the accommodating space 10 of the chassis 1, is electrically connected to the power supply module 7 and the power bridge boards 21, 22, 23, 24, and distributes the electric power to the power bridge boards 21, 22, 23, 24.

The trays 4 are removably inserted into the motherboard area 102 of the accommodating space 10 of the chassis 1, and correspond in position to the power bridge boards 21, 22, 23, 24, respectively. Each of the trays 4 includes a tray body 40 that accommodates a respective one of the motherboards 51, 52, 53, 54 therein, and a handle 41 that is connected to the tray body 40 and that is accessible for removal of the tray body 40 out of the accommodating space 10.

Figure 5:
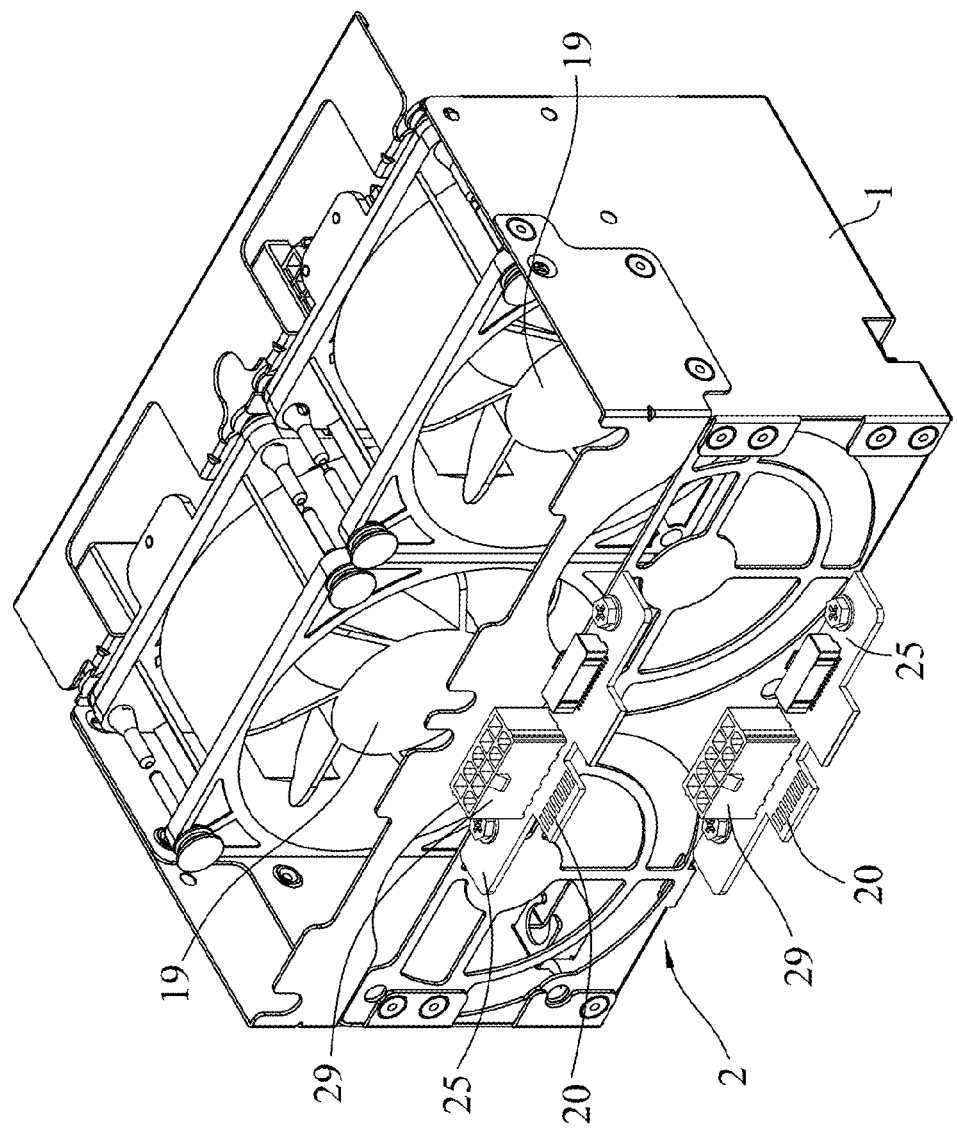
FIG. 5 is a perspective view of the embodiment, illustrating a plurality of fans of the server and two of the power bridge boards.

Referring to FIGS. 2, 3 and 5, each of the power bridge boards 21, 22, 23, 24 includes a bridge board body 25, a power receiving connector 29 disposed on a top surface of the bridge board body 25 and receiving the electric power, and a first power connector 20 located at a side of the bridge board body 25 and outputting the electric power. In this embodiment, the bridge board body 25 of each of the power bridge boards 21, 22, 23, 24 is fixedly mounted to the chassis 1 and disposed adjacent to the fans 19, Therefore, when each of the trays 4, which accommodates the respective one of the motherboards 51, 52, 53, 54, is removed out of the accommodating space 10, a corresponding one of the power bridge boards 21, 22, 23, 24 remains fixedly disposed in the accommodating space 10.

Each of the motherboards 51, 52, 53, 54 is fixedly received in the respectively one of the trays 4, and includes a motherboard body 55, and a second power connector 50 that is disposed on a top surface of the motherboard body 55, and that is detachably and electrically connected to the first power connector 20 of a respective one of the power bridge boards 21, 22, 23, 24. The motherboard body 55 of each of the motherboards 51, 52, 53, 54 is substantially parallel to and spaced apart from the bridge board body 25 of a respective one of the power bridge boards 21, 22, 23, 24 in a longitudinal direction (Z) (see FIG. 3), so as to permit connection between the second power connector 50 and a corresponding one of the first power connectors 20 of the power bridge boards 21, 22, 23, 24 when a corresponding one of the trays 4 is inserted into the accommodating space 10.

In this embodiment, the first power connector 20 of each of the power bridge boards 21, 22, 23, 24 is configured as a gold finger structure, and the second power connector 50 of each of the motherboards 51, 52, 53, 54 is configured as a socket. Alternatively, in other variations of the embodiment, the first power connector 20 of each of the power bridge boards 21, 22, 23, 24 may be configured as a socket, and the second power connector 50 of each of the motherboards 51, 52, 53, 54 may be configured as a gold finger structure.

Figure 4:
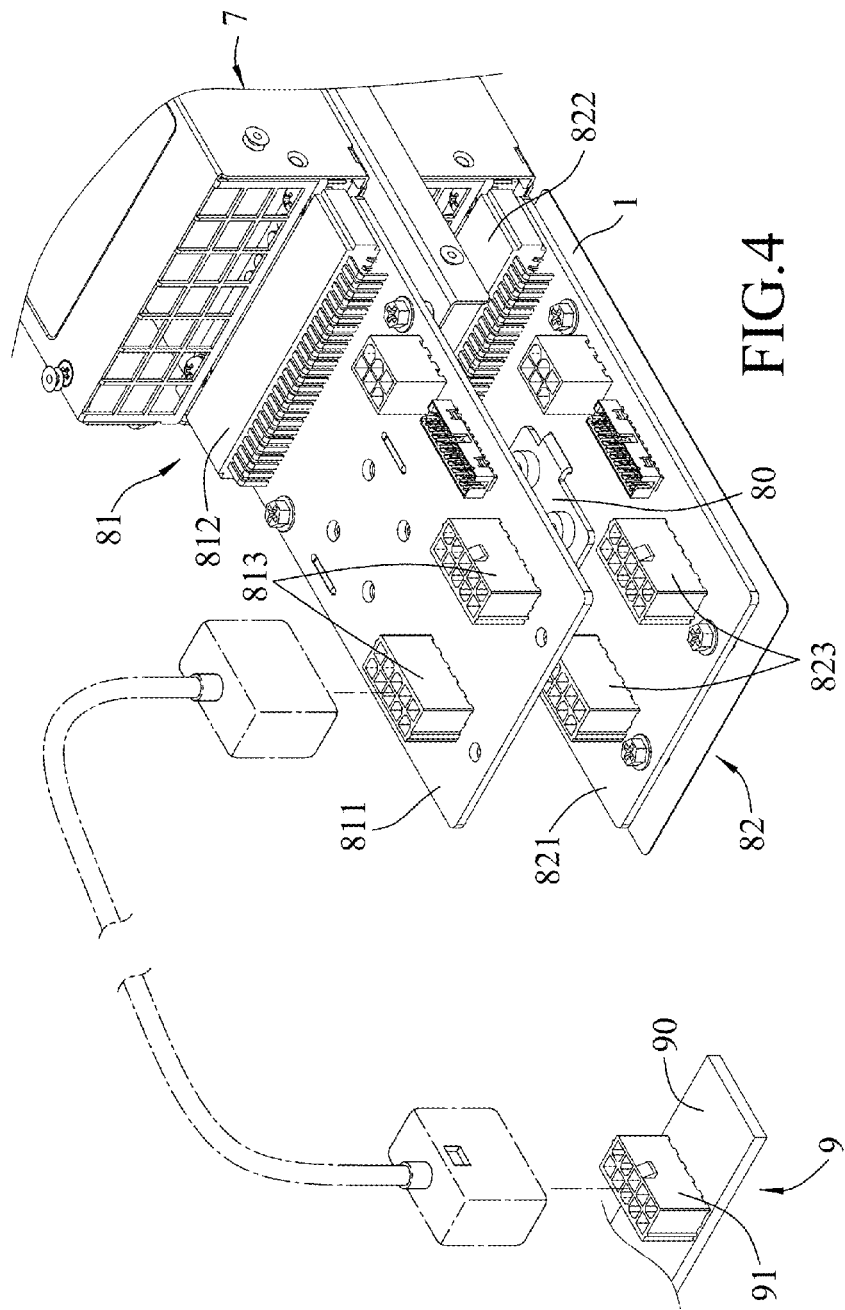
FIG. 4 is a fragmentary perspective view of the embodiment, illustrating the power distributors and the control board.

Referring to FIGS. 1 and 4, the power distributing module 8 includes a first power distributor 81, a second power distributor 82 that is disposed under and spaced apart from the first power distributor 81 in the longitudinal direction (Z), and a mounting plate 80 that is disposed between the first and second power distributors 81, 82. The first power distributor 81 includes a first distributor body 811, a power receiving connector 812 disposed on an end of the first distributor body 811, and two power connectors 813 disposed on a top surface of the first distributor body 811, The second power distributor 82 includes a second distributor body 821, a power receiving connector 822 disposed on an end of the second distributor body 821, and two power connectors 823 disposed on a top surface of the second distributor body 821.

To assemble the first and second power distributors 81, 82, the power receiving connector 822 of the second power distributor 82 is electrically connected to a corresponding one of the power connectors of the power supply module 7, and then the second distributor body 821 is fixedly mounted to the chassis 1. Next, the mounting plate 80 is fixedly mounted on the second distributor body 821. Afterwards, the power receiving connector 812 of the first power distributor 81 is electrically connected to a corresponding one of the power connectors of the power supply module 7, and then the first distributor body 811 of the first power distributor 81 is fixedly mounted on the mounting plate 80.

Referring to FIGS. 1, 2 and 4, the backplate 3 is fixed to the chassis 1 and is located between the data storage device area 101 and the fans 19. That is, the backplate 3 is located behind the data storage device area 101. The control board 9 is fixedly disposed between the fans 19 and the backplate 3, and includes a board body 90 and four power connectors 91, 92, 93, 94 (the power connector 91 is shown in FIG. 4) disposed on the board body 90.

Referring to FIGS. 2, 4 and 5, the power receiving connector 29 of the first power bridge board 21 is electrically connected to one of the power connectors 813 of the first power distributor 81. The power connector 91 of the control board 9 is electrically connected to the other one of the power connectors 813 of the first power distributor 81. The first power connector 20 of the first power bridge board 21 is electrically connected to the second power connector 50 (see FIG. 3) of the first motherboard 51. In a similar manner, the first power connector 20 of the second power bridge board 22 is electrically connected to one of the power connectors 823 of the second power distributor 82. The power connector 92 of the control board 9 is electrically connected to the other one of the power connectors 823 of the second power distributor 82. The first power connector 20 of the second power bridge board 22 is electrically connected to the second power connector 50 of the second motherboard 52.

The power connector 93 of the control board 9 is electrically connected to the power receiving connector 29 of the third power bridge board 23. The power connector 94 of the control board 9 is electrically connected to the power receiving connector 29 of the fourth power bridge board 24, In this embodiment, the above-mentioned power connectors are electrically connected via flexible flat cables (see FIG, 4).

Referring to FIGS. 2, 3 and 5, the first power connector 20 of the third power bridge board 23 is electrically connected to the second power connector 50 of the third motherboard 53, The first power connector 20 of the fourth power bridge board 24 is electrically connected to the second power connector 50 of the fourth motherboard 54, The first power distributor 81 is electrically connected to the first power bridge board 21 and distributes the electric power to the first power bridge board 21 and the control board 9. The second power distributor 82 is electrically connected to the second power bridge board 22 and distributes the electric power to the second power bridge board 22 and the control board 9.

The control board 9 delivers the electric power to the third and fourth power bridge boards 23, 24 so that the first, second, third and fourth power bridge boards 21, 22, 23, 24 output the electric power to the first, second, third and fourth motherboards 51, 52, 53, 54, respectively.

Referring back to FIGS. 1 and 3, the backplate 3 includes four first signal connectors 31. Each of the signal bridge boards 6 has one end (not shown) electrically connected to a respective one of the motherboards 51, 52, 53, 54, and the other end protruding outwardly from the tray body 40 of a respective one of the trays 4, Each of the signal bridge boards 6 includes a second signal connector 61 that is detachably connected to a respective one of the first signal connectors 31 of the backplate 3.

In this embodiment, each of the first signal connectors 31 of the backplate 3 is configured as a socket, and the second signal connector 61 of each of the signal bridge boards 6 is configured as a gold finger structure. In other embodiments of this disclosure, the second signal connector 61 of each of the signal bridge boards 6 may be configured as a socket and each of the first signal connectors 31 of the backplate 3 may be configured as a gold finger structure.

The protective strips 400 are respectively attached to side surfaces of the signal bridge boards 6. Each of the protective strips 400 has one end fixed to an inner surface of the tray body 40 of a respective one of the trays 4, and the other end protruding outwardly from the respective one of the trays 4 and fixed to a respective one of the signal bridge boards 6. The protective strips 400 serve as a protection for the respective signal bridge boards 6. It should be noted that in other embodiments, the protective strips 400 and the respective signal bridge boards 6 can be interconnected in an interference fit manner.

Referring to FIGS. 1 to 3, the board body of each of the power bridge boards 21, 22, 23, 24 and the backplate 3 are spaced apart from each other in a transverse direction (X) perpendicular to the longitudinal direction (Z). A distance (a) between the second power connector 50 of each of the motherboards 51, 52, 53, 54 and the second signal connector 61 of a respective one of the signal bridge boards 6 is substantially equal to a distance (b) between each of the power bridge boards 21, 22, 23, 24 and the backplate 3 in the transverse direction (X), wherein the phrase "substantially equal" means "equal" or "almost equal." As such, when each of the trays 4 is inserted in t o the accommodating space 10 of the chassis 1, the second signal connector 61 of a respective one of the signal bridge boards 6 is inserted into and electrically connected to a corresponding one of the first signal connectors 31 of the backplate 3. At the same time, the second power connector 50 of a corresponding one of the motherboards 51, 52, 53, 54 is inserted into and electrically connected to the respective one of the first power connector 20 of the power bridge boards 21, 22, 23, 24 without using flexible flat cables.

During a hot swapping process, removal of each of the trays 4 out of the accommodating space 10 results in removal and electrical disconnection of the second signal connector 61 of the respective one of the signal bridge boards 6 from the respective one of the first signal connectors 31 of the backplate 3, and removal and electrical disconnection of the second power connector 50 of the respective one of the motherboards 51, 52, 53, 54 from the first power connector 20 of the respective one of the power bridge boards 21, 22, 23, 24 at the same time.

It should be noted that the numbers of the power bridge boards 21, 22, 23, 24 of the power bridge module 2, of the trays 4, of the protective strips 400, of the motherboards 51, 52, 53, 54 of the motherboard module 5, and of the signal bridge boards 6 may be one in other variations of the embodiment. Similar function of quick and easy electrical connections or disconnections between the first and second signal connectors 31, 61, and between the first and second power connectors 20, 50 can be achieved.

To sum up, by virtue of the second power connectors 50 that are disposed on the motherboards 51, 52, 53, 54, and the power bridge boards 21, 22, 23, 24, which include the first power connectors 20 that are disposed between the motherboards 51, 52, 53, 54 and the fans 19, when each of the trays 4 are removed, the abovementioned configurations enable relatively simple electrical disconnections between the corresponding first and second signal connectors 31, 61, and between the corresponding first and second power connectors 20, 50, thereby permitting a relatively quick and easy hot swapping process.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A server comprising:
   a chassis defining an accommodating space;
   a power supply module disposed in said accommodating space;
   a power bridge module disposed in said accommodating space, electrically connected to said power supply module for receiving electric power therefrom, and including a first power connector for outputting the electric power;
   a backplate disposed in said accommodating space and including a first signal connector;
   a tray removably inserted into said accommodating space;
   a motherboard module fixedly mounted to said tray and including a second power connector detachably and electrically connected to said first power connector of said power bridge module; and a signal bridge board electrically connected to said motherboard module, and including a second signal connector that is detachably and electrically connected to said first signal connector of said backplate;

wherein removal of said tray out of said accommodating space results in removal and electrical disconnection of said second signal connector from said first signal connector of said backplate, and removal and electrical disconnection of said second power connector of said motherboard module from said first power connector of said power bridge module at the same time;

wherein said tray includes a tray body that accommodates said motherboard module therein, and a handle that is connected to said tray body and that is accessible for removal of said tray body out of said accommodating space of said chassis;

wherein said server further comprises a protective strip that is attached to said signal bridge board, and that has one end fixed to said tray body of said tray, and the other end protruding outwardly from said tray and fixed to said signal bridge board;

wherein said power bridge module further includes a bridge board body, said motherboard module further including a motherboard body that is mounted with said second power connector, and that is substantially parallel to and spaced apart from said bridge board body so as to permit connection between said first and second power connectors when said tray is inserted into said accommodating space; and wherein said bridge board body and said backplate are spaced apart from each other in a transverse direction, a distance between said power bridge module and said backplate in the transverse direction being substantially equal to a distance between said second power connector and said second signal connector of said signal bridge board in the transverse direction.

2. The server as claimed in claim 1, wherein said first power connector of said power bridge module is configured as a gold finger structure, said second power connector of said motherboard module being configured as a socket.

3. The server as claimed in claim 1, wherein said first signal connector of said backplate is configured as a socket, said second signal connector of said signal bridge board being configured as a gold finger structure.

4. The server as claimed in claim 1, further comprising at least one fan that is disposed in said accommodating space, said bridge board body being fixedly mounted to said chassis and adjacent to said at least one fan.

5. A server comprising:
a chassis defining an accommodating space;
a power supply module disposed in said accommodating space;
a power bridge module disposed in said accommodating space, and including a plurality of power bridge boards that are electrically connected to said power supply module for receiving electric power therefrom, each of said power bridge boards including a first power connector for outputting the electric power;
a backplate disposed in said accommodating space and including a plurality of first signal connectors;
a plurality of trays removably inserted into said accommodating space and corresponding in position to said power bridge boards, respectively;
a motherboard module fixedly mounted to said trays, and including a plurality of motherboards each having a second power connector that is detachably and electrically connected to said first power connector of a respective one of said power bridge boards; and a plurality of signal bridge boards electrically and respectively connected to said motherboards, each of said signal bridge boards including a second signal connector that is detachably connected to a respective one of said first signal connectors of said backplate;

wherein removal of each of said trays out of said accommodating space results in removal and electrical disconnection of said second signal connector of a respective one of said signal bridge boards from the respective one of said first signal connectors of said backplate, and removal and electrical disconnection of said second power connector of a respective one of said motherboards from said first power connector of the respective one of said power bridge boards at the same time;

wherein each of said trays includes a tray body that accommodates a respective one of said motherboards therein, and a handle that is connected to said tray body and accessible for removal of said tray body out of said accommodating space of said chassis;

wherein said server further comprises a plurality protective strips that are respectively attached to said signal bridge boards, each of said protective strips having one end fixed to said tray body of a respective one of said trays, and the other end protruding outwardly from the respective one of said trays and fixed to a respective one of said signal bridge boards;

wherein each of said power bridge boards further includes a bridge board body, each of said motherboards further including a motherboard body that is mounted with said second power connector of a corresponding one of said motherboards, and that is spaced apart from said bridge board body of a respective one of said power bridge boards, so as to permit connection between said second power connector and a corresponding one of said first power connectors of said power bridge boards when a corresponding one of said trays is inserted into said accommodating space; and wherein said bridge board body and said backplate are spaced apart from each other in a transverse direction, a distance between each of said power bridge boards and said backplate in the transverse direction being substantially equal to a distance between each of said second power connectors of said motherboards and said second signal connector of a respective one of said signal bridge boards in the transverse direction.

6. The server as claimed in claim 5, wherein said first power connector of each of said power bridge boards is configured as a gold finger structure, said second power connector of each of said motherboards being configured as a socket.

7. The server as claimed in claim 5, wherein each of said first signal connectors of said backplate is configured as a socket, said second signal connector of each of said signal bridge boards being configured as a gold finger structure.

8. The server as claimed in claim 5, further comprising a power distributing module that is disposed in said accommodating space of said chassis, that is electrically connected to said power supply module and said power bridge boards, and that distributes the electric power to said power bridge boards.

9. The server as claimed in claim 8, further comprising a control board, wherein:

said motherboard module includes a first motherboard, a second mother board, a third motherboard and a fourth motherboard;

said power bridge module includes a first bridge board, a second bridge board, a third bridge board and a fourth bridge board electrically connected to said first, second, third and fourth motherboards, respectively;

said power distributing module includes a first power distributor that is electrically connected to said first bridge board and that distributes the electric power to said first bridge board and said control board, said power distributing module further including a second power distributor that is electrically connected to said second bridge board and that distributes the electric power to said second bridge board and said control board; and said control board delivers the electric power to said third and fourth bridge boards so that said first, second, third and fourth power bridge boards output the electric power to said first, second, third and fourth motherboards, respectively.

10. The server as claimed in claim 9, further comprising a plurality of fans disposed in said accommodating space of said chassis, said control board being fixedly disposed between said fans and said backplate.

11. The server as claimed in claim 9, wherein said second power distributor is disposed under and spaced apart from said first power distributor, said power distributing module further including a mounting plate that is disposed between said first and second power distributors and that permits said first and second power distributors to be fixedly mounted thereon.

12. The server as claimed in claim 5, further comprising a plurality of fans that are disposed in said accommodating space, said bridge board body of each of said power bridge boards being fixedly mounted to said chassis and adjacent to said fans.

* * * * *